United States Patent [19]
Bielinski

[11] Patent Number: 5,881,560
[45] Date of Patent: Mar. 16, 1999

[54] THERMOELECTRIC COOLING SYSTEM

[76] Inventor: George Bielinski, 1606 Carver La., Appleton, Wis. 54904

[21] Appl. No.: 728,128

[22] Filed: Sep. 30, 1996

Related U.S. Application Data

[63] Continuation-in-part of Ser. No. 406,287, Mar. 17, 1995, Pat. No. 5,609,032, which is a continuation-in-part of Ser. No. 217,182, Mar. 23, 1994, abandoned.

[51] Int. Cl.$^6$ ........................................ F25B 21/02
[52] U.S. Cl. ................................. 62/3.2; 62/3.7; 62/457.8
[58] Field of Search ................................. 62/3.2, 3.3, 3.6, 62/3.62, 457.8, 457.9, 3.7

[56] References Cited

U.S. PATENT DOCUMENTS

| | | | |
|---|---|---|---|
| 3,168,816 | 2/1965 | Petrie | 62/3.6 |
| 3,310,953 | 3/1967 | Rait | 62/3.62 |
| 3,500,649 | 3/1970 | Feldman | 62/3.6 |
| 3,839,876 | 10/1974 | Privas | 62/3.62 |
| 4,581,898 | 4/1986 | Preis | 62/3.62 |
| 5,060,479 | 10/1991 | Carmi et al. | 62/3.62 |

FOREIGN PATENT DOCUMENTS

| | | | |
|---|---|---|---|
| 2563617 | 10/1985 | France | 62/3.6 |
| 1139858 | 11/1962 | Germany | 62/3.6 |
| 1188627 | 3/1965 | Germany | 62/3.6 |
| 844652 | 8/1960 | United Kingdom | 62/3.6 |

*Primary Examiner*—William Doerrler
*Attorney, Agent, or Firm*—Ryan Kromholz & Manion. S.C.

[57] ABSTRACT

A thermoelectric cooling system having an electric circuit including a d.c. power source providing direct current through the electric circuit, a thermoelectric module having at least one heat sink and at least one heat source capable of being cooled to a predetermined temperature range, and a control assembly. The d.c. power source, the control assembly, and the thermoelectric module being connected to each other in series. The control assembly comprising a thermostat control switch mechanism and a resistive element connected to each other in parallel. The thermostat control switch mechanism having a sensor generally coupled to the heat source of the thermoelectric module, the thermostat control switch mechanism being open in the predetermined temperature range. The resistive element having a predetermined resistance sufficient for a level of voltage to be provided to the thermoelectric module, when the thermostat control switch mechanism is open, sufficient to substantially prevent reversal of the heat source and the heat sink. The thermoelectric cooling system being used in a process comprising placing an article of interest on the heat source, setting the thermostat to a desired predetermined temperature range, actuating the d.c. power source, and cooling the article of interest.

14 Claims, 8 Drawing Sheets

THERMOELECTRIC COOLING SYSTEM

This application is a continuation-in-part of application Ser. No. 08/406,287 filed on 17 Mar., 1995 now U.S. Pat. No. 5,609,032, which was a continuation-in-part of parent application Ser. No. 08/217,182 filed on 23 Mar., 1994 and now abandoned.

BACKGROUND OF THE INVENTION

The present invention relates generally to the field of thermoelectric devices and more particularly to the thermoelectric cooling system with improved performance and/or efficiency characteristics. The present invention is designed to have many applications including use in a bread box or as part of a wine rack.

Thermoelectric cooling systems are analogous to conventional refrigeration cooling systems. For example, a conventional cooling system includes an evaporator, a compressor, and a condenser. In the evaporator or cold section, pressurized refrigerant is allowed to expand, boil, and evaporate. During the change of state from a liquid to a gas, energy in the form of heat is absorbed. In the next step, the compressor re-compresses the gas into a liquid. Further, the condenser expels the heat absorbed at the evaporate and the extra heat added by the compressor to the ambient environment.

A thermoelectric cooling system has similar subassemblies. However, thermoelectric cooling is specifically the abstraction of heat from electronic components by Peltier effect, greatly improved and made practicable with solid-state thermoelectric materials, e.g., $Bi_2Te_3$. Devices using this effect, e.g. frigistors, are used for automatic temperature control etc. and are energized by d.c. thermoelectric materials are any set of materials (metals) which constitute a thermoelectric system, e.g., "binary" (bismuth and tellurium), "ternary" (silver, antimony and tellurium), "quaternary" (bismuth, tellurium, selenium and antimony, called "Neelium"). The Peltier effect is a phenomenon whereby heat is liberated or absorbed at a junction when current passes from one metal to another. In this application, a cold junction (the place where the heat source or load is located) is defined as the assembly where energy in the form of heat is absorbed when current passes from one metal to another. A hot junction (the place where the heat sink is located) is the assembly which is attached to a heat exchanger and through which the heat that is liberated, when current passes from one metal to another, is transferred to the ambient environment.

A conventional refrigeration system must maintain a closed environment which is isolated from the ambient. Further, conventional refrigeration systems have a large amount of insulation and cannot be ventilated without loss of cooling effect. Thus, conventional cooling systems may contain odors of the articles placed within and such odors may be transferred to other articles placed within the cooling system, with obviously undesirable results. Further, conventional cooling systems produce humidity which may adversely affect the physical characteristics of the product being cooled, e.g., texture, taste, shelf life, etc. of certain food articles which may be placed therein. For example, fresh baked bread may, if humidity is not carefully controlled, become mushy on at least one side during the cooling process.

Thermoelectric cooling systems, by contrast, provide a measure of advantage to the several shortcomings noted above. However, thermoelectric cooling systems lack efficiency in certain respects because, upon interruption of the power supply, the current reverses flow such that what was a heat source becomes the heat sink, and what was the heat sink now becomes the heat source.

It is an objective of the present invention to provide a thermoelectric cooling circuit that substantially prevents reversal of the heat source and heat sink when power is substantially interrupted upon a predetermined temperature range being reached at the heat source. It is an additional objective of the present invention to provide a bread box and a wine cooling rack using the thermoelectric cooling circuit of the present invention.

SUMMARY OF THE INVENTION

The invention may be generally described as a thermoelectric cooling system having an electric circuit comprising a d.c. power source for providing direct current throughout the electric circuit, a thermoelectric module having at least one heat sink and at least one heat source capable of being cooled to a predetermined temperature range, and a control assembly. The d.c. power source, the control assembly, and the thermoelectric module are connected to each other in series. The control assembly comprises a thermostat control switch mechanism and a resistive element connected to each other in parallel. The thermostat control switch mechanism has a sensor coupled to or thermally associated with the heat source of the thermoelectric module so that the temperature of the heat source can be monitored. The thermostat control switch mechanism is normally open in the predetermined temperature range detected by the sensor. The resistive element having a predetermined resistance sufficient for a level of voltage to be provided to the thermoelectric module, when the thermostat control switch mechanism is open, sufficient to substantially prevent reversal of the heat source and the heat sink.

More particularly, the circuit of the present invention may be used in a thermoelectric bread box or a thermoelectric wine bottle cooling rack. The thermoelectric bread box is ventilated to maintain freshness and at the same time keep wrapped bread at a reduced temperature to prevent spoilage by mold growth. The device is almost devoid of insulation except to prevent condensation inside the thermoelectric element. The device functions with a thermostatic control that is shunted by an 800–10,000 ohm resistor to maintain voltage to the thermoelectric device but not enough amperage to activate the thermoelectric element when the thermostat is electrically open. (The type of resistor depends upon the voltage or current necessary to be maintained.) This unique condition of maintaining the voltage prevents the heat energy that was transferred to the heat sink from returning to the cooled side, due to the reversing action of the Peltier junctions, when the thermostat opens. Another unusual feature is the conforming cooling plate that is placed around the bread in the shape of a substantially U-shaped absorber to remove the heat. From test data it appears that when a conforming cooling plate is used objects cool faster. When conformal cooling plates or heat absorbers are employed on a bottle or container of liquid, e.g., wine, stratification is prevented and circulation is promoted inside the bottle which aids cooling. An explanation for this effect on liquids or wrapped bread may be that long wave radiation frequencies of 2 microns or greater, coming from wrapped bread, glass bottles, or other containers are absorbed by a conformal aluminum or copper plate (or plate having similar characteristics) if it surrounds a substantial portion, at least 75%, of the object to be cooled. An alternative explanation may be that substantially all the surface area of the body being cooled is associated with the conformal cooling surface. This method cools a bottle of water faster than a refrigerator using circulated cold air. This can be accomplished without insulating the entire box.

Alternatively, it has recently been found that effective cooling of liquids, like wine, in containers, like bottles, may be accomplished with a conformal cooling plate (first body) in cooling association with less than 75% of the object to be cooled, provided, a portion of the conformal cooling plate is. in cooling contact or association with at least a portion of one side of the container or object to be cooled (the load). Liquids cooled by such a structure, or such a process, avoid stratification and substantially unequal cooling. Accordingly, uniform cooling of a liquid and maintenance of such uniform cooling may be accomplished by use of this alternative structure and method.

Alternatively, the thermoelectric cooling system of the present invention may be described as a first body which is the heat source, a second body which is the heat sink, and an interface composed of thermoelectric materials thermally connecting or coupling the first body with the second body. The interface being connected in a series to a d.c. power source. The first body operable to absorb head and thereafter transfer the heat to the second body through the interface, by the Peltier effect, when current is applied to the interface from the d.c. power source. The thermoelectric cooling system further including a thermostat and a resistor which are electrically connected in parallel to one another. The parallel connection of the thermostat and the resistor creates a control device which allows the flow of current in a direction which prevents movement of heat from the second body to the first body when the thermostat control switch is opened. A minimum voltage is retained in the circuit and the heat return to the first body is thereby minimized.

The first body includes a shelf or conforming plate mounted within a housing, and wherein the load or article of interest (typically articles of food or beverage containers) to be cooled is placed on the shelf or within the conforming plate. The shelf or conforming plate are preferably made of a highly heat conductive material like metal. The second body, made of a heat conductive material, includes a radiator, preferably, having a plurality of fins which radiate heat therefrom. The design of the first body and the second body is such that a steady state device is created, that is, the radiator emanates an amount of heat which is substantially equivalent to the heat generated by the mass of the shelf and the load on the shelf and the heat produced by the electrical circuit.

The interface comprises a semiconductor or plurality of semiconductors which produce the desired Peltier effect. Varying numbers and types of semiconductors or other suitable thermoelectric materials may be employed to achieve different degrees of cooling.

The housing includes several apertures which serve to ventilate the article of interest which is placed upon the shelf and cooled by the effects of conduction. The present invention requires little, if any, insulation.

The present invention thus is efficient and is substantially a steady state device in that it is constantly on. The present invention further allows ventilation to keep the article of interest fresh and does not produce excessive humidity.

These and other benefits of the present invention will be apparent to one skilled in the art from the following description.

DETAILED DESCRIPTION

Although the disclosure hereof is detailed and exact to enable those skilled in the art to practice the invention, the physical embodiments herein disclosed merely exemplify the invention which may be embodied in other specific structure. While the preferred embodiment has been described, the details may be changed without departing from the invention, which is defined by the claims.

Figure 1:
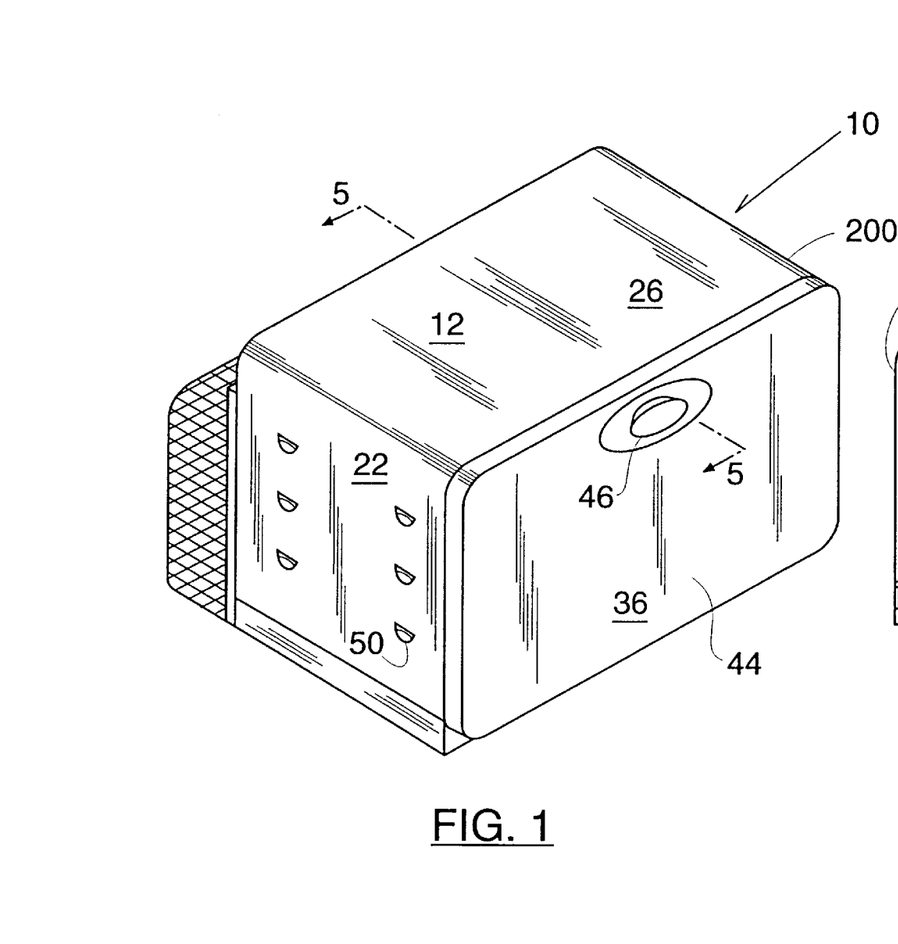
FIG. 1 is a perspective view of the thermoelectric cooling system of the present invention in a bread box with the door closed.

With reference to the drawings a thermoelectric cooling system in accordance with the present invention is shown generally at numeral 10. The thermoelectric cooling system 10 generally includes a housing 12, a first body 14, a second body 16, an interface 18, and a thermostatic control unit 70. The housing 12 is generally configured in the shape of a box for use of the present invention as an electrically cooled bread box 200. The housing 12 includes a left side wall 22, a right side wall 24, which opposes the left side wall 22, a top wall 26, a bottom wall 28 which opposes the top wall 26, and a back wall 30. The left side wall 22, the right side wall 24, the top wall 26 and the bottom wall 28 each terminate in an edge 32 which opposes the back wall 30, and which defines an opening 34, see FIGS. 1 and 5A.

Figure 2:
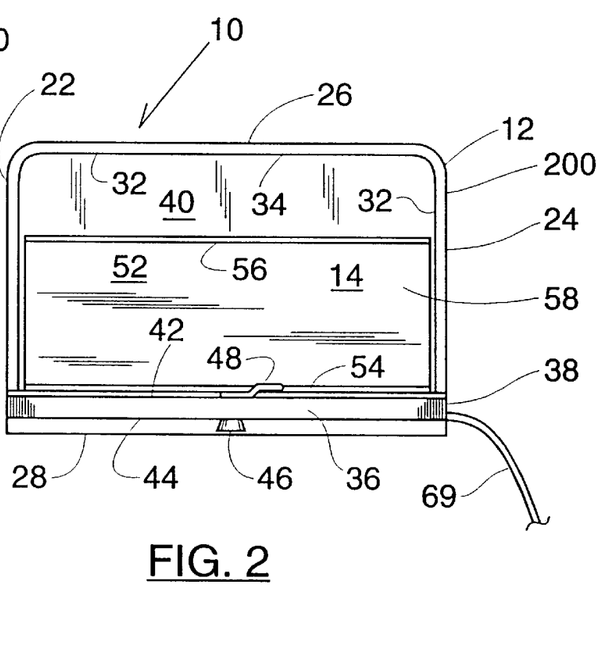
FIG. 2 is a front view of the thermoelectric cooling system of the present invention in a bread box with the door open.
Figure 3A:
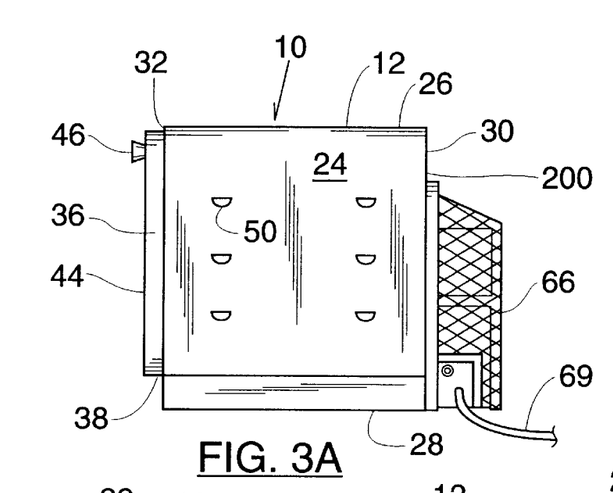
FIG. 3A is a side elevational view of the thermoelectric cooling system of the present invention in a bread box showing an alternate structure including a fan for blowing air over the heat sink.
Figure 3B:
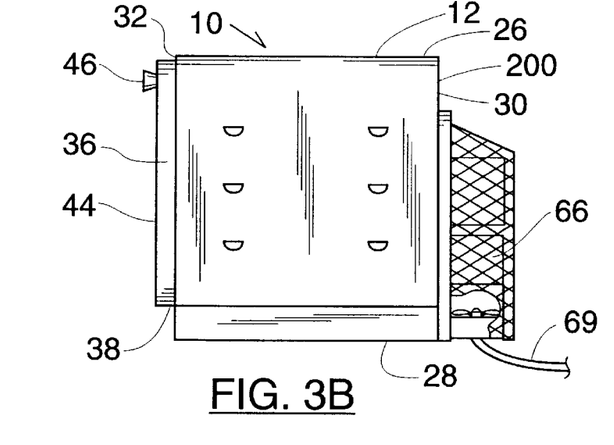
FIG. 3 is a side elevational view of the thermoelectric cooling system of the present invention in a bread box with the door closed.

A door 36 is attached by hinges 38 to the bottom wall 28 at the edge 32. The door 36 pivots on the hinges 38 to open and close the opening 34. Further, FIGS. 2 and 5A depict the door 36 in an open position; and FIGS. 1, and 3–5 show the door 36 in a closed position. The walls 22, 24, 26, 28, and 30, and the door 36 generally define an interior compartment or cavity 40. The individual walls 22, 24, 26, 28, and 30 are made from a thermally conductive material. The door 36 has an inwardly-facing surface 42 which faces the interior compartment 40 when the door 36 is closed, and an outwardly facing surface 44. The door 36 further includes a handle 46 and a latch 48, the handle 46 extends normally outwardly from the exterior facing surface 44 and is shaped such that it is easily grasped and manipulated by a user. The handle 46 extends through the door 36 and is attached to the latch 48 such that rotation of the handle 46 simultaneously rotates the latch 48. The combination latch 48 and the handle 46 are located proximal the top wall 26 when the door 36 is closed. The edge 32 is lipped such that rotation of the handle 46 by the user will rotate the latch to engage with the edge 32. The door 36 is thereby secured in the closed position by rotation of the handle 46 to engage the latch 48 with the edge 32. The door 36 is released by rotation of the handle 46 in a reverse direction.

The housing 12 further includes apertures 50 which are located in the left side wall 22 and the right side wall 24. The apertures 50 serve to ventilate the articles of interest which are placed within the housing 12 to be cooled. Thus the thermoelectric cooling system 10 of the present invention is capable of ventilating the article(s) of interest placed therein, and therefore will not result in the creation or retention of odors which may adversely affect other articles placed therein, such as food products, for example. The housing 12 as depicted herein is sized to permit the cooling of a food product such as a loaf of bread. The housing 12 is generally fashioned to have an appearance such that it is an attractive addition to a counter top or other area of a kitchen. The exterior of the housing 12 is painted with reflective white paint that prevents normal radiation from entering into the interior compartment 40.

Figure 5:
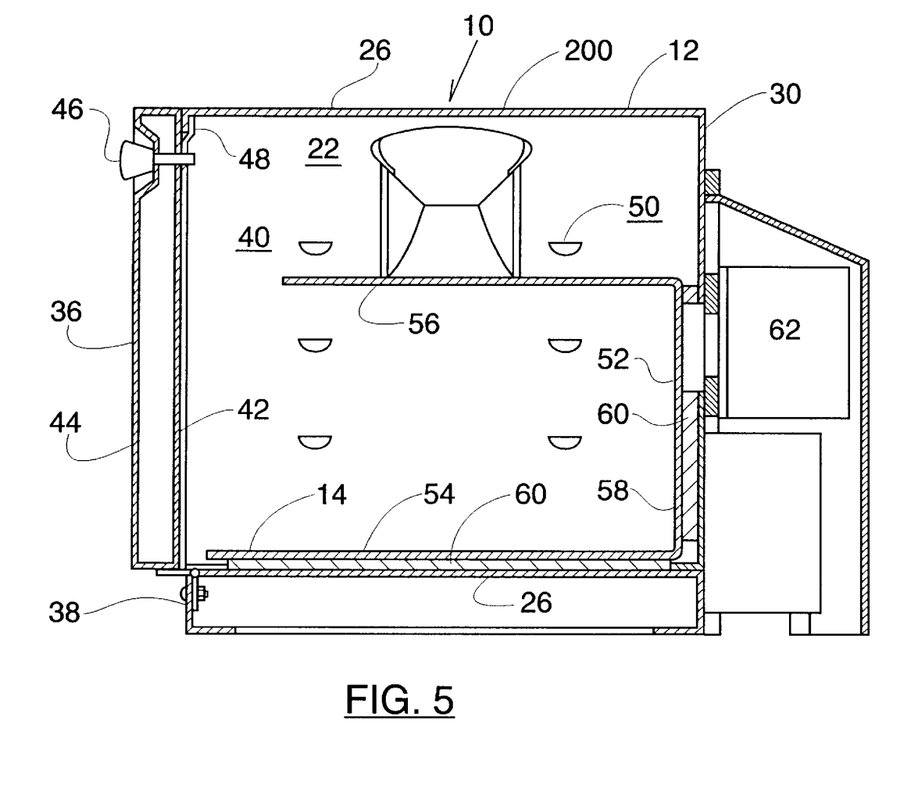
FIG. 5 is a vertical sectional view taken from a position along line 5—5 of FIG. 1.

The first body 14 is a heat source of the thermoelectric cooling system 10. The first body 14 includes a shelf 52 which is mounted within the interior compartment 40 of the housing 12. The shelf 52 extends between the left side wall 22 and the right side wall 24, and, as viewed in the cross-sectional view of FIG. 5, is generally U-shaped in configuration when viewed from either the right or the left side. The U-shape of the shelf 52 includes a first leg 54, a second leg 56, which is substantially parallel to the first leg 54, and a third leg 58 which extends there between and is perpendicular to the first and second legs 52 and 54, respectively. The first leg 54 of the shelf 52 is positioned against the bottom wall 28 and the third leg 58 is positioned against the back wall 30. A layer of thermal insulation 60 is placed between the legs 4 and 58 and the walls 28 and 30, respectively. The thermal insulation 60 is located as shown in the drawing to thermally insulate the shelf 52 thereby optimizing its cooling efficiency. The insulation 60 is preferably made of polyethylene or a similar material and which further inhibits the growth of mold or similar organisms within the housing 12. The shelf 52 is held in place against the walls 28 and 30 by rivets (not shown). The shelf 52 is preferably made of a highly heat conductive material like metal; e.g., aluminum.

Because the shelf 52 is made of aluminum, the shelf 52 has excellent heat conduction capability to remove heat from the articles of interest placed thereon. Other substrates or combination of substrates would be useful in this application providing the meet the aforementioned performance parameters. The size of the housing 12 and the shelf 52 is such that there is sufficient clearance between the second leg 56 and the top wall 26, or between the first leg 54 and the second leg 56 to place the articles on top either the first leg 54 or the second leg 56. As explained in further detail below, the articles of interest are cooled through the shelf 52 by the effects of conduction and absorption of heat at the Peltier junction.

The interface 18 is located intermediate the first body 14 and the second body 16. The interface 18 is a semiconductor module. Suitable modules for the purpose of this invention are manufactured by Melcor Materials Electronic Products Corporation of Trenton, N.J. The specific module is dependent upon the intended cooling specifications of the thermoelectric cooling system 10. Modules are available in a great variety of sizes, shapes, operating current, operating voltages, and ranges of heat pumping capacity. The semiconductor modules are well known in the prior are encased within a layer of ceramic coating 65 which serves to keep out moisture and act as an insulator such that the modules are electrically insulated from the heat exchanger 14 and 16. The second body 16 acts as a heat sink. The first body 14 and the second body 16 are coupled to the interface 18 so that heat energy may be transferred from the first body 14 to the second body 16.

Figure 4:
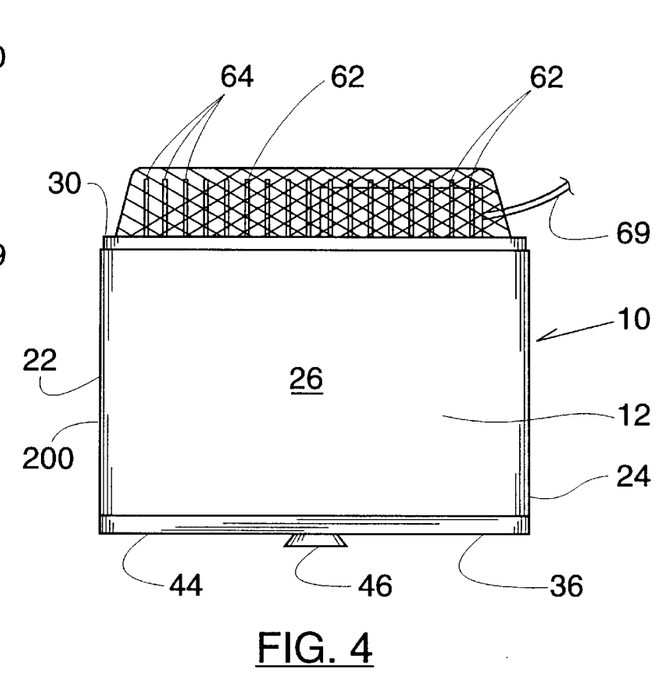
FIG. 4 is a top plan view of the thermoelectric cooling system of the present invention with the door closed.
Figure 5A:
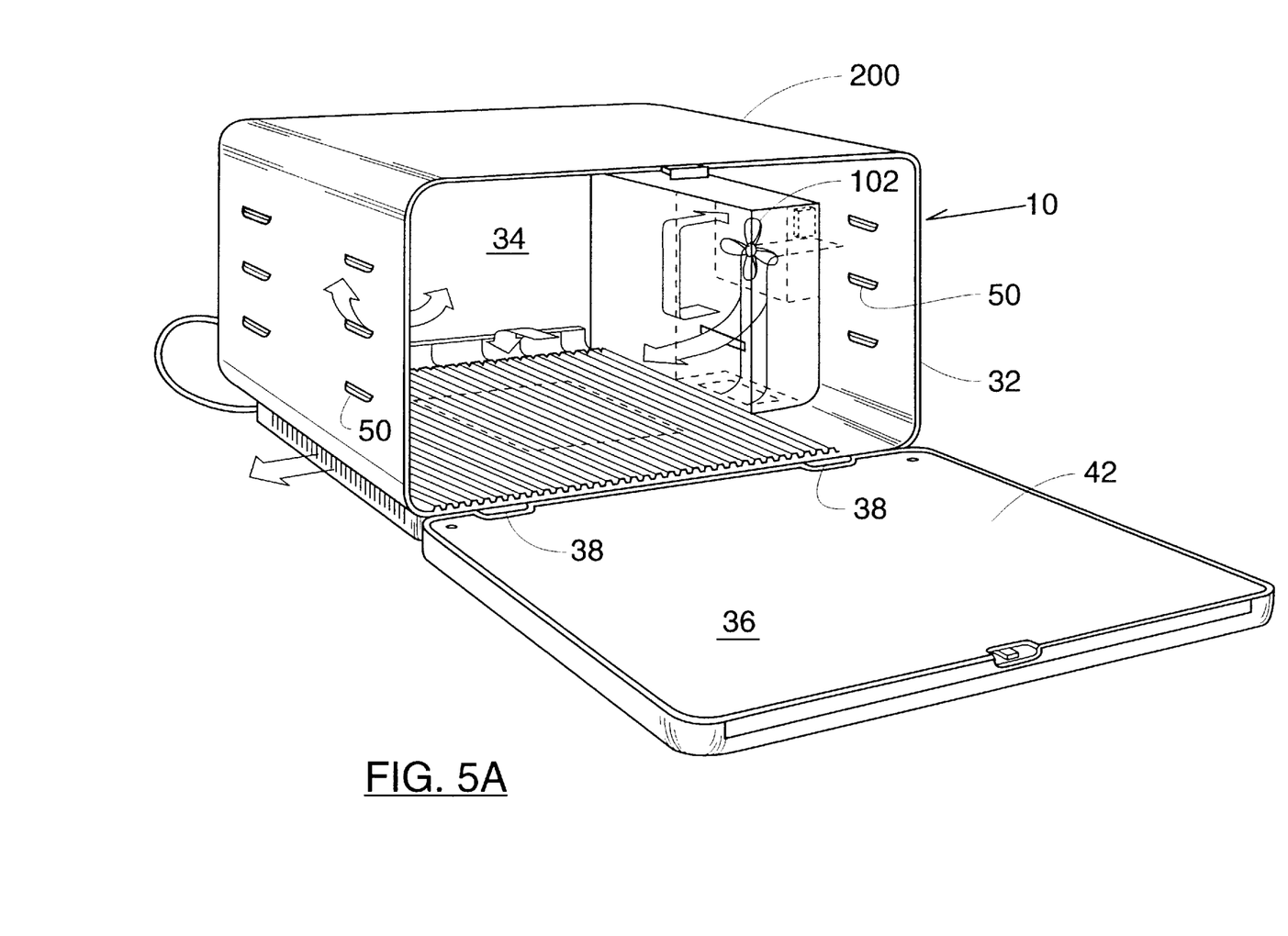
FIG. 5A is a front elevational view of the thermoelectric cooling system of the present invention in a bread box showing the door open and a fan for blowing out excess moisture in response to a signal from a humidistat.

The second body 16 includes a radiator 62 having a plurality of fins 64 which are shown in FIGS. 4 and 5 for providing increased surface area for disposal of heat. The radiator 62 has a black anodized coating to optimize radiation of heat therefrom. The design of the first body 14, and the second body 16 is such that a steady state device is created, that is, the radiator 62 substantially emanates the quantity of heat generated by the mass of the shelf 52 and the heat generated by the electrical circuit. The heat balance described herein may be established by a calculation of heat transfer according to known methods, or by a trial-and-error process.

Figure 6:
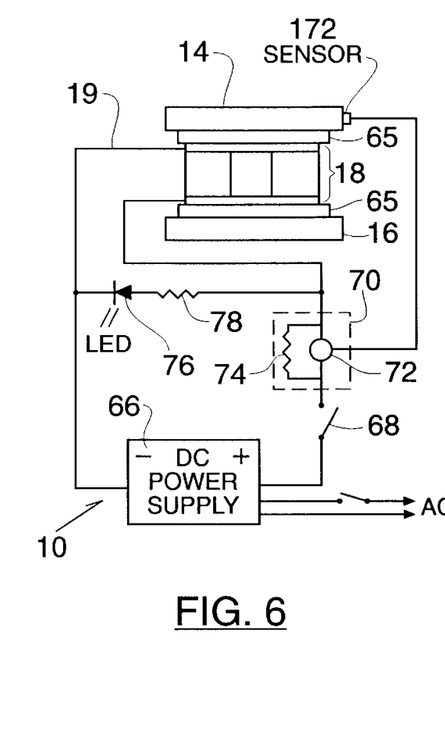
FIG. 6 is a schematic diagram of the electrical circuit used in the present invention.

FIG. 6 discloses one embodiment of the circuitry employed in the present invention. The electrical circuit 19 of the thermoelectric cooling system 10 includes a d.c. power source 66, a switch 68, and a thermostatic control unit 70. The switch 68 is simply a manual switch by which the user may turn the thermoelectric cooling system 10 on or off. The thermostatic control unit 70 comprises a thermostat 72 and a 1000 ohm resistor 74 which are electrically connected in parallel with each other. The thermostat 72 is typically of a bimetal type which turns the circuit on and off at the threshold cooling temperature. The connection of the resistor 74 in parallel with the thermostat 72 maintains a lower voltage, approximately 0.75 volts, in the circuit 19 when the temperature, sensed by a temperature sensor 172 of the thermostat 72, reaches the desired range and the thermostat 72 opens the connection between it and the thermoelectric module or interface 18. For bread the desired temperature range is 49°–55° F. and for wine 33°–40° F.; although personal taste may lead a person to choose other temperature ranges.

Once the thermostat 72 opens the connection between the power supply 66 and the module or interface 18 is substantially cut but the minimum 0.75 volts voltage is maintained through the shunt resistor 74. Power to the circuit 19 is never totally cut off; if it were then the heat source and heat sink would reverse. The minimum voltage prevents reversal of the heat source and heat sink so that the cold side stays cold since the 0.75 volt of electricity allowed to run through the circuit 19 is sufficient to overcome the roughly 0.3 volt of reversal voltage of the circuit 19. Accordingly, so long as a voltage is maintained sufficient to overcome the reversal voltage the heat source and the heat sink will not reverse and the temperature of the load or article of interest will be maintained in the desired temperature range. In the present invention this is a desired cooler temperature for keeping the load cool although reversal of the polarity of the power source would result in keeping the load in a desired warmer temperature range using the same circuit 19 disclosed herein.

The electrical circuit 19 of FIG. 6 further shows an LED 76 and a resistor 78 which are electrically connected to each other and disposed to the opposite polarity of the power source. The purpose of the LED 76 is to indicate to the user whether the thermoelectric cooling system 10 has been turned on or off by the switch 68. The resistor 78 reduces the voltage through the LED to a voltage level with which it is compatible.

The specifications of the housing 12, the shelf 52, and the electrical circuit 19 may be altered in order to be adapted to different specific uses. For example, one particularly desirable use would be to apply the thermoelectric cooling system 10 as a cooled bread box 200. See FIGS. 1–5A. In such an application, the housing 12 and the shelf 52 must be sized to accommodate a loaf of bread. The thermoelectric cooling system 10 is particularly well suited to bakery products because the system 10 does not accumulate and transfer odors as would occur with a conventional refrigerator having an evaporator, a compressor, and a condenser. Because bread is cooled by conduction through the shelf 52, the apertures 50 do not affect the cooling of the bread or other articles of interest because the bread is cooled through a wrapper about the loaf which retains the cool air around the bread in the wrapper. The thermoelectric system 10 further does not produce an environment which contributes humidity to the cooling of the articles of interest, which is further beneficial to an extended shelf life for bakery products. The power draw of the thermoelectric cooling system 10 as applied to cooling of a loaf of bread to around a range of 49°–55° F. is about 40 watts. It is to be understood that the thermoelectric cooling system 10 as described above and specifically applied to a use as a bread box 200 may be used for many other products, for example, bakery products and medicines which require refrigeration. It is to be further understood that the specification of the thermoelectric cooling system 10 may be altered for other contemplated uses which may require alternate physical dimensions or degrees of cooling. Additional cooling may be accomplished, for example, by incorporating additional semiconductors into the electrical circuit to increase the amounts of cooling.

Figure 7:
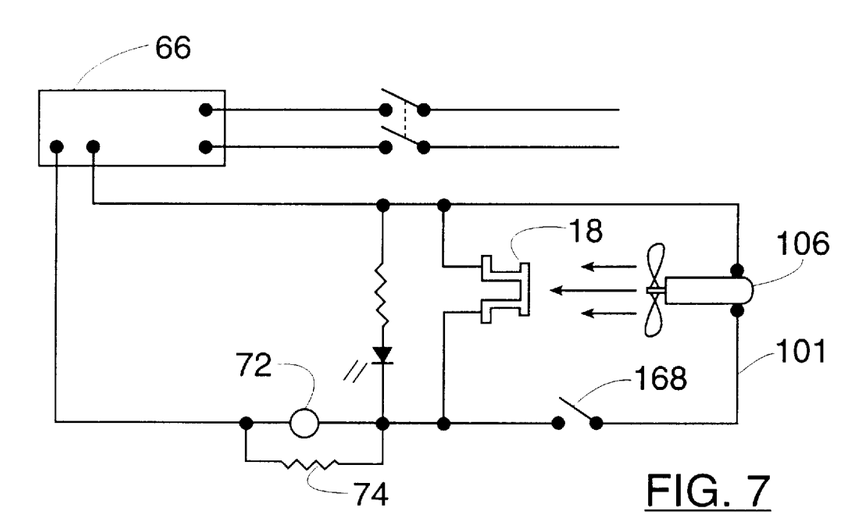
FIG. 7 is an alternative schematic diagram of the electrical circuit used in the present invention; preferably for a beverage cooling rack.
Figure 8:
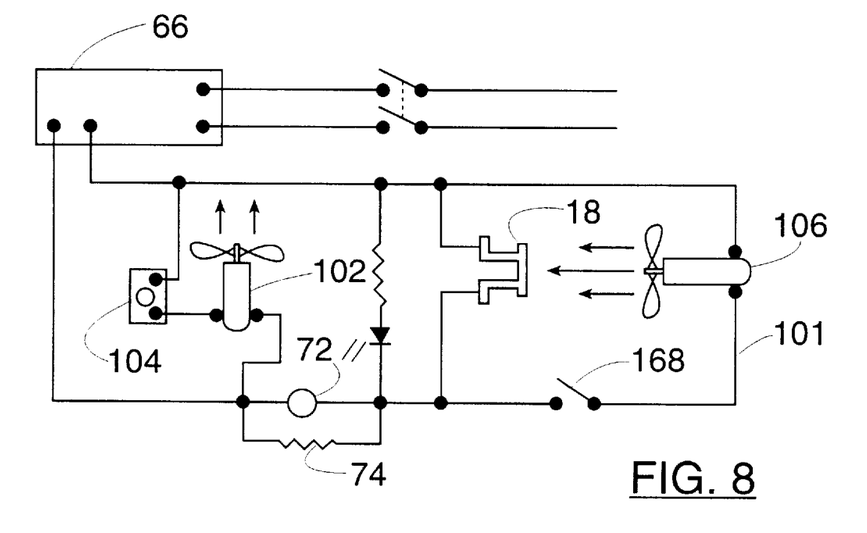
FIG. 8 is an alternative schematic diagram of the electrical circuit used in the present invention; preferably for a bread box.

Further, the electric circuit of the thermoelectric cooling system 10 could be further modified as shown in FIGS. 7 and 8 (and as shown if FIGS. 3A and 5A) to include a quick cooling fan 106 or, as shown only in FIG. 8, to further include a vent fan 102 and a humidistat 104. See circuits 100 and 101 of FIGS. 8 and 7.

The humidistat 104 could be set to a desired humidity level and actuate the vent fan 102, much in the same manner that a thermostat may be used for that purpose, so that when the desired humidity level is exceeded the air containing the excessive moisture is quickly expelled.

Additionally, referring to both FIGS. 7 and 8 a cooling fan 106 could be added to either the beverage cooler and the bread box of the thermoelectric cooling system 10 to provide for a quick chill feature. The cooling fan 106 would be directed at the heat sink or second body 16 as shown in FIGS. 3A, and 7–10. The cooling fan 106 is connected in parallel to the interface 18. A switch 168 is provided for independent manual actuation of the cooling fan 106 when the electric circuit 100 or 101 of FIGS. 8 and 7 is energized. Actuation of the switch 168 will turn on the cooling fan 106 and thereby increase the rate of heat dissipation from the heat sink or second body 16, quickly cooling whatever load is placed on the heat source; e.g., a wine bottle, a beverage bottle, or a loaf of bread.

Figure 9:
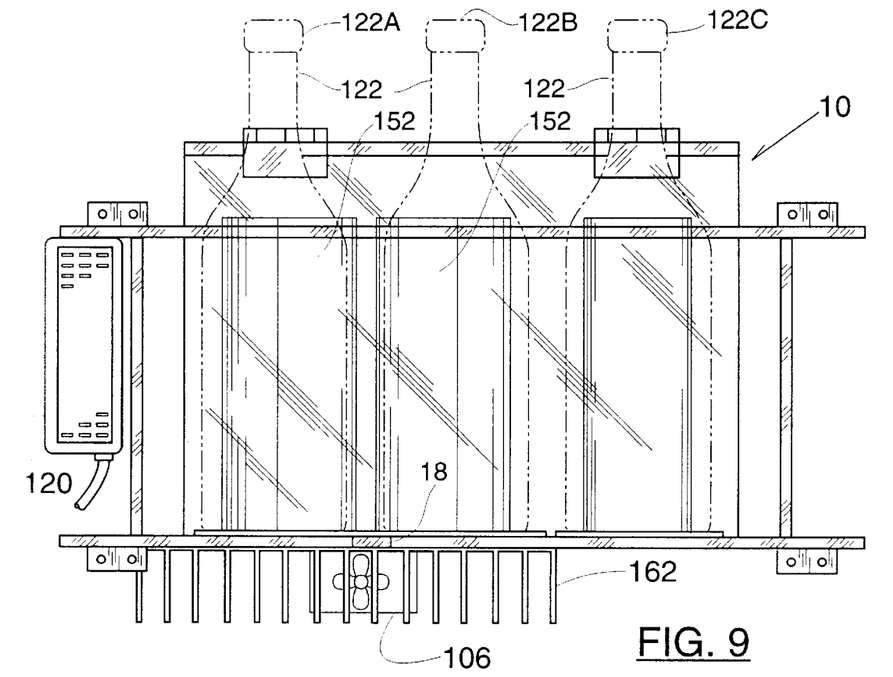
FIG. 9 is a bottom plan view of the thermoelectric cooling system of the present invention in a wine rack.
Figure 10:
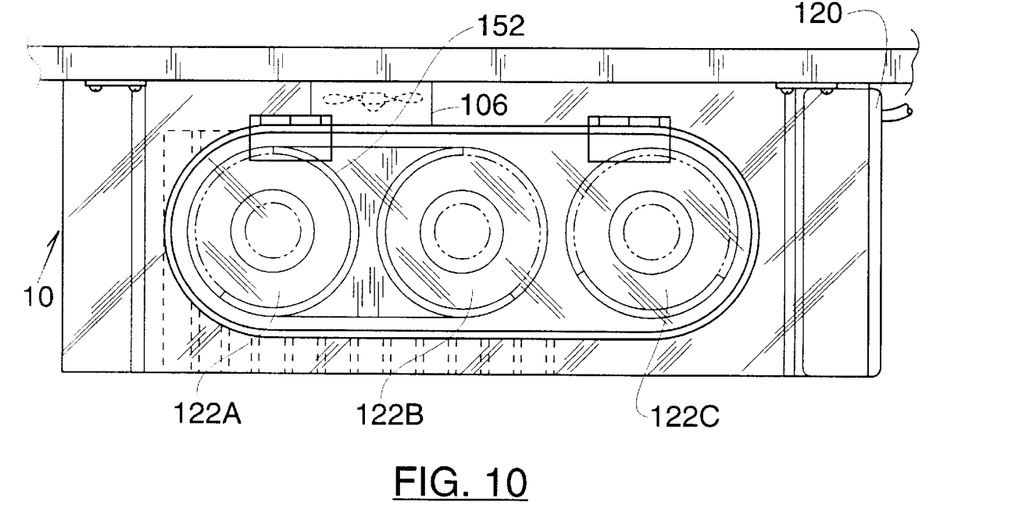
FIG. 10 is a front end view of the thermoelectric cooling system of the present invention in a wine rack showing the wine rack mounted under a shelf.
Figure 11:
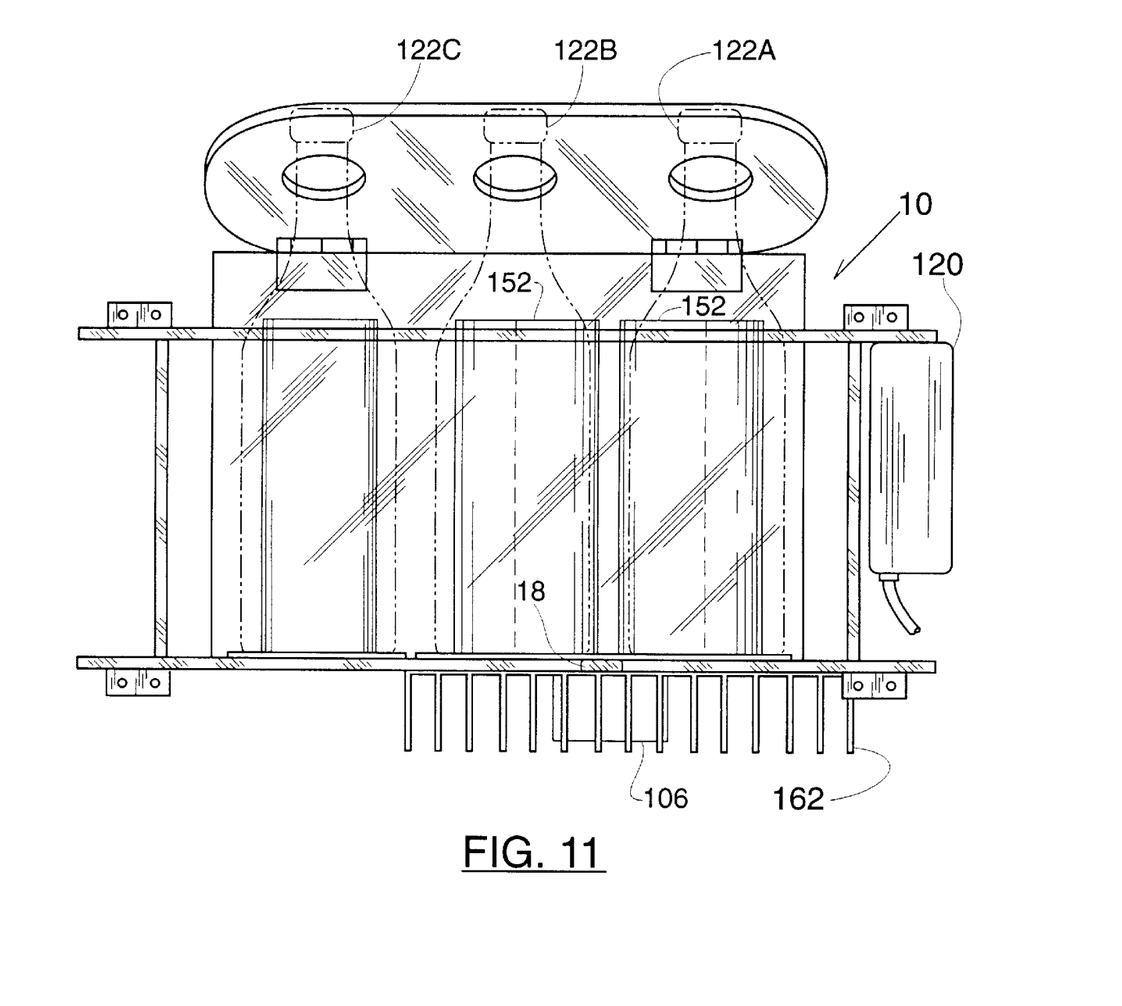
FIG. 11 is a top plan view of the thermoelectric cooling system of the present invention in a wine rack showing the door of the wine rack in an open position.

Referring to FIG. 7 and FIGS. 9–11, the wine rack 120 using the cooling system 10 of the present invention may be seen. The wine rack 120 is designed to hold as many wine bottles 122 as is desired. In the present embodiment only two of the wine bottles 122, wine bottles 122A and 122B, are thermally associated or connected with the first body 14 or heat source. The third bottle 122C, as shown in FIGS. 9–11, is not in thermal association with the first body 14 and thus is not cooled but remains at room temperature. Consequently, the rack 100 may be used to keep a predetermined number of wine bottles chilled and at room temperature simultaneously. The wine bottles 122A and 122B that are to be chilled are thermally associated with the first body 14 through curved metal sleeves 152 which substantially conform to the shape of the body of the bottles 122A and 122B to facilitate cooling of the wine without stratification.

In the operation of the present invention, the user would plug the thermoelectric cooling system 10 into a standard a.c. outlet or other power source. Where alternating current is employed it is converted to d.c. by rectification with suitable electronics; e.g., a d.c. power supply. The user may turn the thermoelectric cooling system 10 on or off by means of the switch 68. The shelf 52 or sleeves 152 then become the heat source and the radiator 62 or 162 becomes a heat sink. The cooling is adjusted according to the thermostat 72, which turns the circuit on or off to maintain the cooling at a pre-selected threshold value while the switch 68 is engaged. A solid state cooling system 10 thus results in as much as the heat emanated through the radiator 62 or 162 is substantially equivalent to the quantity of heat generated by the mass of the shelf 52 or sleeve 152 and the electrical current that runs through the electrical circuits of FIGS. 6–8.

Figure 12:
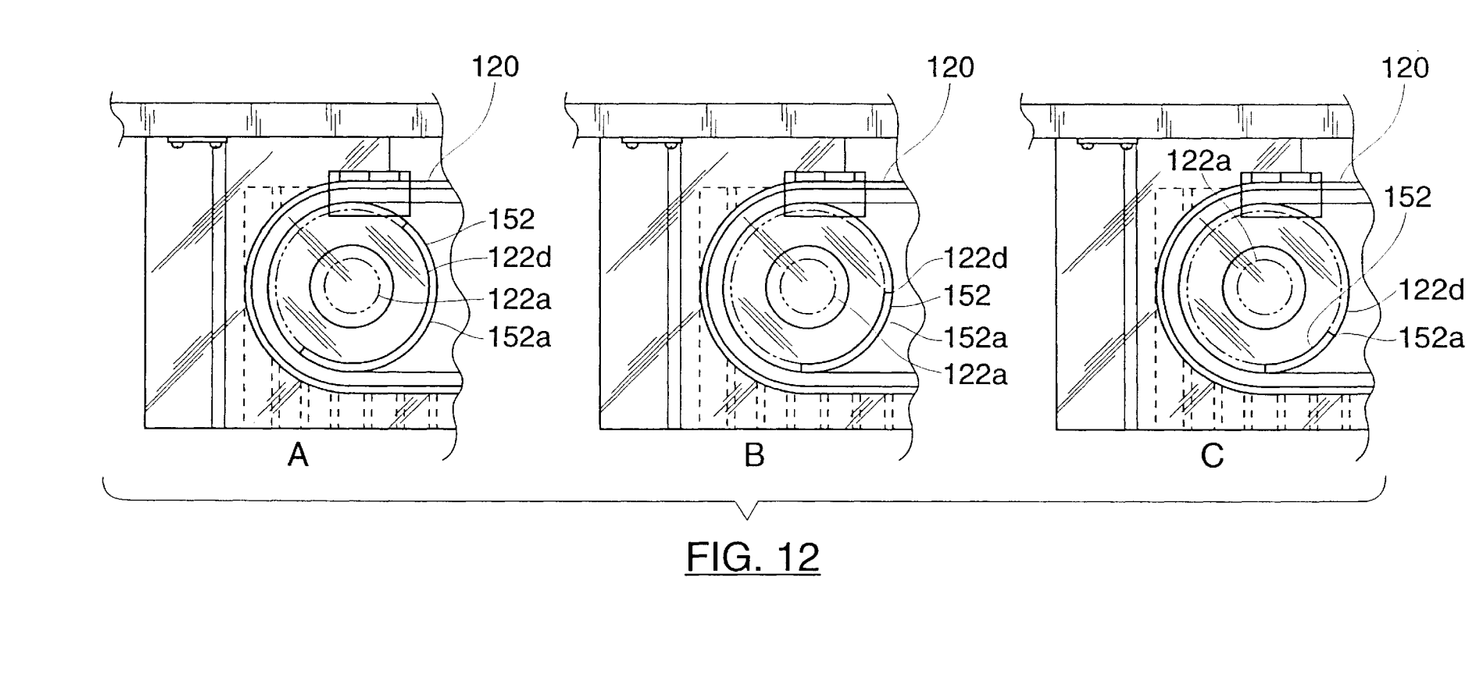
FIG. 12 is a front end view of a portion of the thermoelectric cooling system of the present invention in a wine rack mounted under a shelf and illustrating that the conformal cooling structure of the present invention may be of alternative dimensions provided that at least a portion of the cooling structure maintains cooling association or contact with at least one side of the object to be cooled.

Finally, referring to FIG. 12, the curved metal sleeve 152 which is the conformal cooling structure may be seen to conform to a portion of the object to be cooled which is the wine bottle 122a. References A, B, and C illustrate that the metal sleeve 152 may be of a range of dimensions provided that a portion 152a is kept in cooling contact with a portion of side 122d of the bottle 122a.

The foregoing is considered as illustrative only of the principles of the invention. Furthermore, since numerous modifications and changes will readily occur to those skilled in the art, it is not desired to limit the invention to the exact construction and operation shown and described.

What is claimed is:

1. A thermoelectric cooling system comprising:

a housing;

a thermoelectric module comprising at least one heat sink and at least one heat source;

the heat source comprising a load having a surface area and a first body, a portion of the load's surface area in thermal association with the first body;

an interface intermediate the first body and the heat sink such that the first body, the interface, and the heat sink are mechanically connected in series;

the first body absorbing heat from the load and the heat being transferred through the interface to the heat sink by the Peltier effect when direct current is applied to the interface;

a control assembly comprising a control switch and a resistive element electrically connected to each other in parallel;

the control assembly and the thermoelectric module electrically connected to each other in series;

the resistive element providing a level of voltage to the thermoelectric module sufficient to substantially prevent reversal of the heat source and the heat sink.

2. The thermoelectric cooling system of claim 1, wherein the portion of the surface area of the load in thermal association with the first body is at least 75% of the total surface area of the load.

3. The thermoelectric cooling system of claim 1 wherein the load is a beverage container.

4. The thermoelectric cooling system of claim 3 wherein the beverage container is a wine bottle.

5. The thermoelectric cooling system of claim 1 wherein the first body is in thermal association with a substantial portion of the surface area of the load.

6. The thermoelectric cooling system of claim 1 wherein the load has at least one side and the first body is in thermal association with a portion of said side of said load.

7. The thermoelectric cooling system of claim 6 wherein the load is a wine bottle containing wine.

8. The thermoelectric cooling system of claim 6 wherein the first body is a metal sleeve.

9. A process for cooling a load using a thermoelectric cooling system having a thermoelectric module comprising at least one heat sink and at least one heat source;

the heat source comprising a load having a surface area and a first body, a portion of the load's surface area in thermal association with the first body;

an interface intermediate the first body and the heat sink such that the first body, the interface, and the heat sink are mechanically connected in series;

the first body absorbing heat from the load and the heat being transferred through the interface to the heat sink by the Peltier effect when direct current is applied to the interface;

a control assembly comprising a control switch and a resistive element connected to each other in parallel;

the control assembly and the thermoelectric module connected to each other in series;

the resistive element providing a level of voltage to the thermoelectric module sufficient to substantially prevent reversal of the heat source and the heat sink, the process comprising:

placing the load in contact with the first body; and
applying direct current to the interface.

10. The process of claim 9 wherein the load has at least one side and the first body is in thermal association with a portion of said side of said load.

11. The process of claim 10 wherein the load is a wine bottle containing wine.

12. The process of claim 10 wherein the first body is a metal sleeve.

13. The process of claim 12, wherein the metal sleeve conforms to the shape of at least one side of the load.

14. The thermoelectric cooling system of claim 8, wherein the metal sleeve conforms to the shape of at least one side of the load.

* * * * *